(12) United States Patent
Wang et al.

(10) Patent No.: US 10,825,754 B2
(45) Date of Patent: Nov. 3, 2020

(54) QUAD FLAT NO LEADS PACKAGE WITH LOCKING FEATURE

(71) Applicant: SEMICONDUCTOR COMPONENTS INDUSTRIES, LLC, Phoenix, AZ (US)

(72) Inventors: Soon Wei Wang, Seremban (MY); How Kiat Liew, Ipoh (MY); Jose Felixminia Palagud, Jr., Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 421 days.

(21) Appl. No.: 15/230,179

(22) Filed: Aug. 5, 2016

(65) Prior Publication Data
US 2018/0040539 A1 Feb. 8, 2018

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49541* (2013.01); *H01L 21/4828* (2013.01); *H01L 21/565* (2013.01); *H01L 23/3107* (2013.01); *H01L 23/3142* (2013.01); *H01L 21/561* (2013.01); *H01L 2224/32245* (2013.01); *H01L 2224/48247* (2013.01); *H01L 2224/73265* (2013.01)

(58) Field of Classification Search
CPC ........... H01L 23/49541; H01L 23/3142; H01L 23/3107; H01L 21/4828; H01L 21/565; H01L 2224/73265; H01L 2224/48247; H01L 21/561; H01L 2224/32245; H01L 23/49548

See application file for complete search history.

(56) References Cited

U.S. PATENT DOCUMENTS

| 2013/0256733 A1* | 10/2013 | Lin | H01L 33/62 257/99 |
| 2015/0014832 A1* | 1/2015 | Javier | H01L 24/85 257/675 |

* cited by examiner

*Primary Examiner* — Su C Kim
(74) *Attorney, Agent, or Firm* — Adam R. Stephenson, Ltd.

(57) ABSTRACT

Implementations of semiconductor packages may include: a lead frame having at least one corner lead, the at least one corner lead positioned where two edges of the package meet, and the at least one lead having a half etch on a first portion of the lead and a half etch on a second portion of the lead. The first portion may extend internally into the package to create a mechanical mold compound lock between a mold compound of the package and the lead. The second portion may be located on at least one of the two edges of the package.

8 Claims, 6 Drawing Sheets

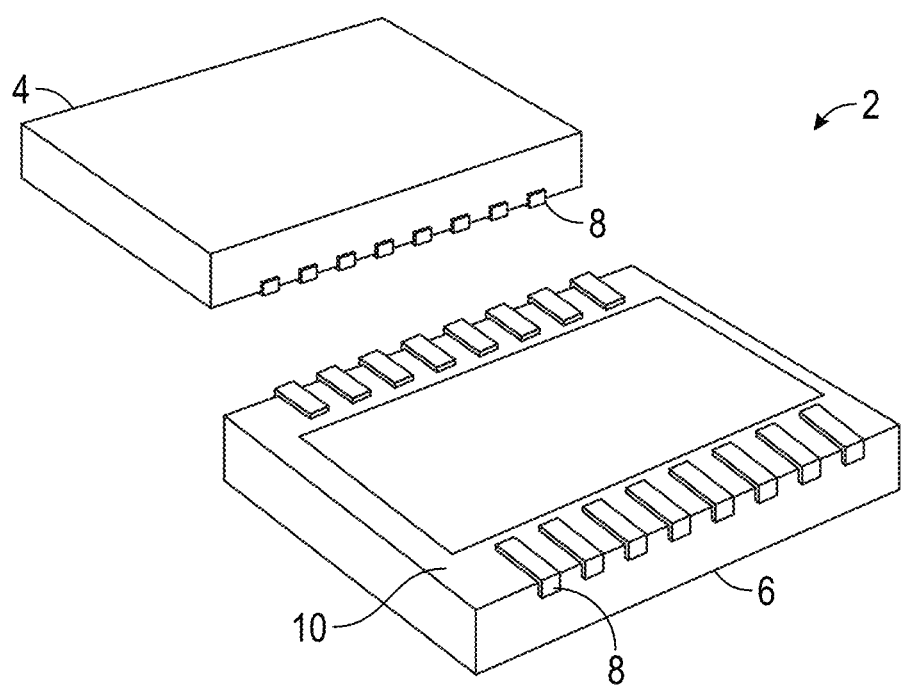
FIG. 1
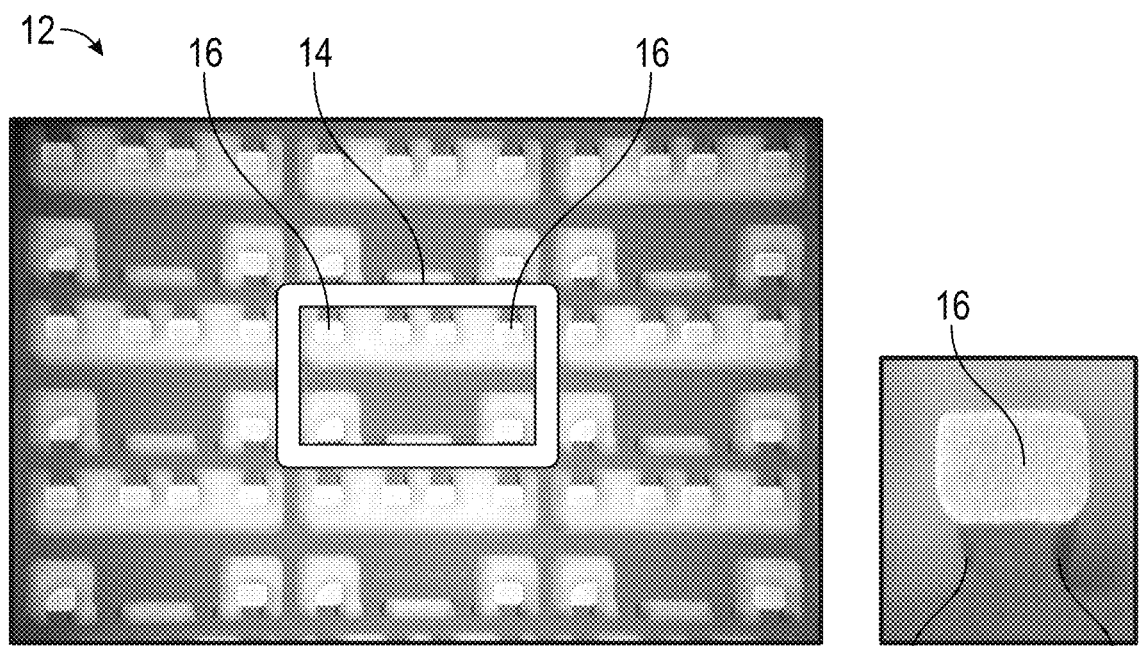
FIG. 2A
FIG. 2B

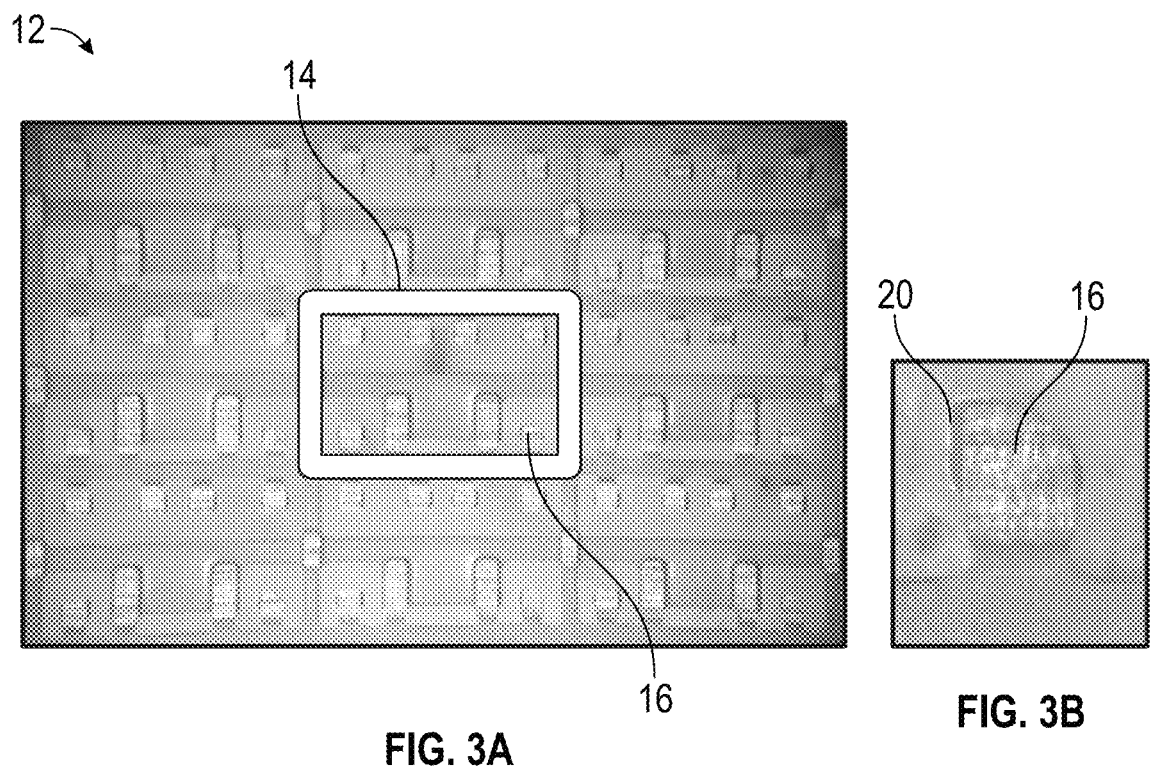
FIG. 3A
FIG. 3B
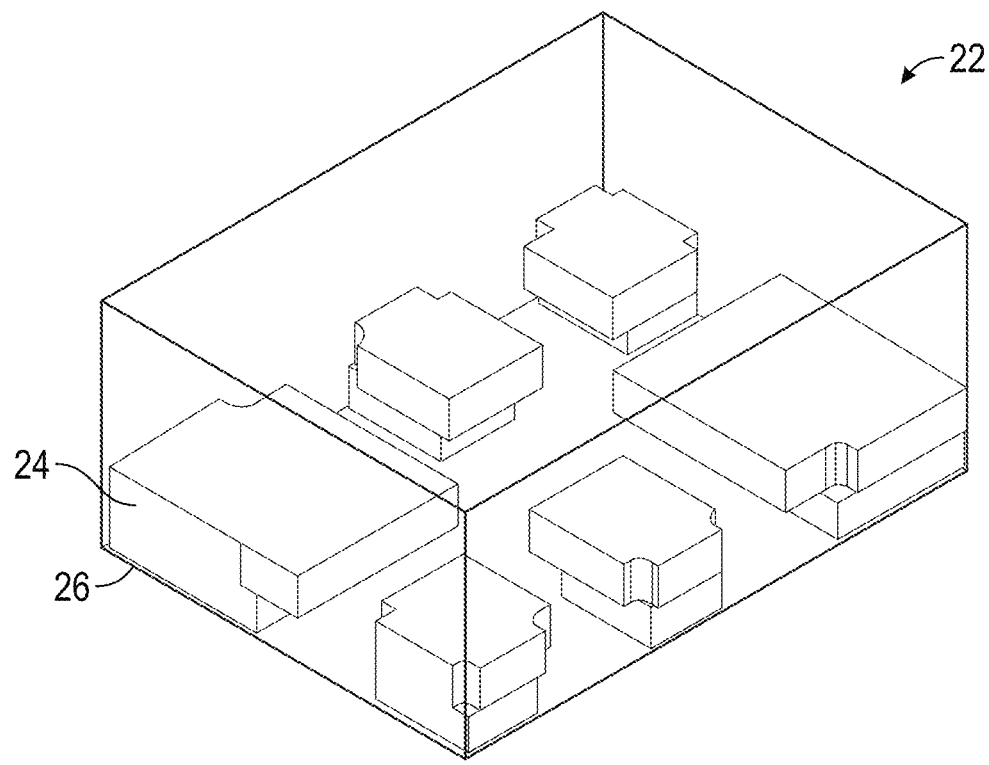
FIG. 4A

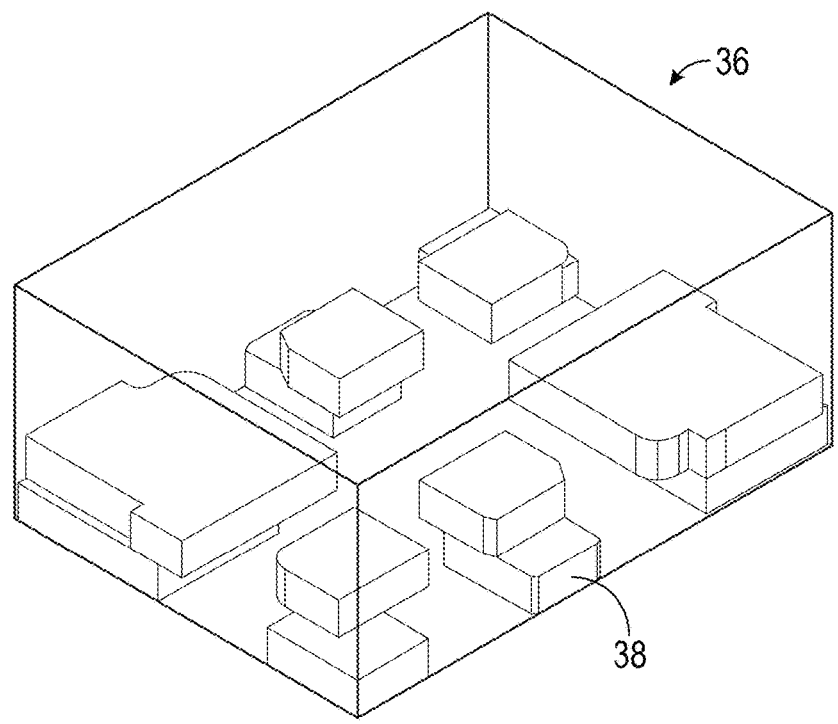
FIG. 6A
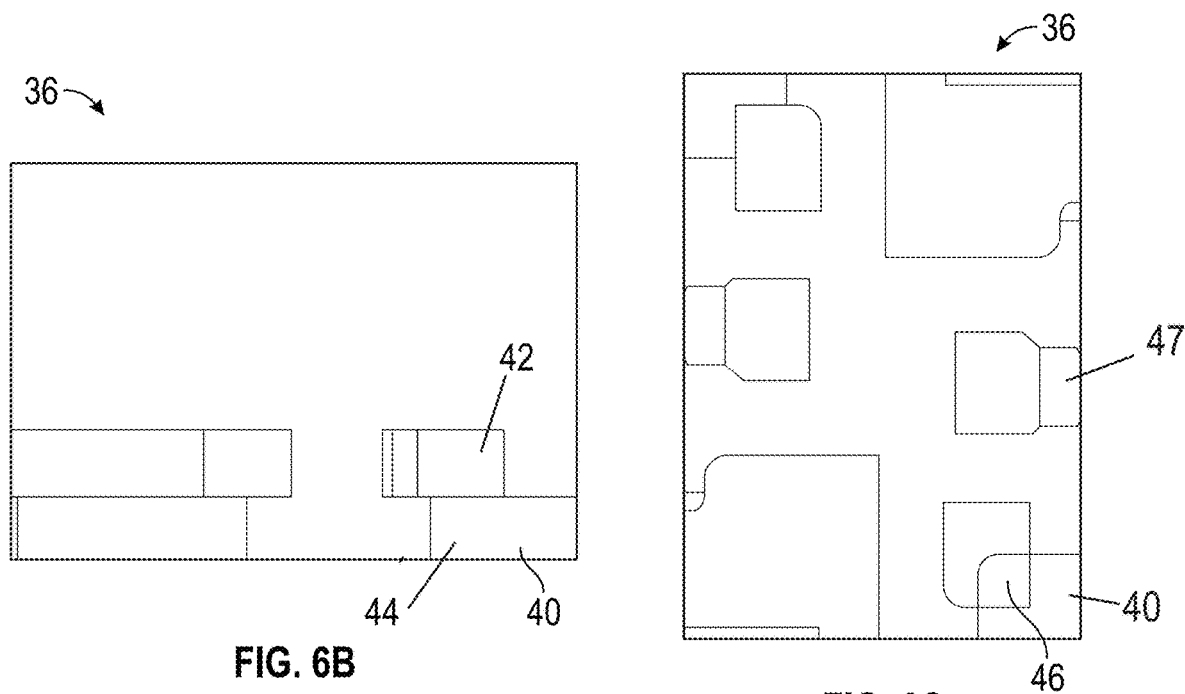
FIG. 6B
FIG. 6C

QUAD FLAT NO LEADS PACKAGE WITH LOCKING FEATURE

Background

1. Technical Field

Aspects of this document relate generally to semiconductor packages, such as quad flat no leads and dual flat no leads packages.

2. Background

Conventionally, quad flat no lead (QFN) and dual flat no lead (DFN) packages have bottom leads that are flush with the edges of the package. They are designed to be directly solderable to a motherboard or other circuit board. Conventional QFN and DFN packages are singulated using processes like sawing which serve to separate the leads of the package from the remainder of the lead frame.

SUMMARY

Implementations of semiconductor packages may include: a lead frame having at least one corner lead, the at least one corner lead positioned where two edges of the package meet, and the at least one lead having a half etch on a first portion of the lead and a half etch on a second portion of the lead. The first portion may extend internally into the package to create a mechanical mold compound lock between a mold compound of the package and the lead, and the second portion may be located on at least one of the two edges of the package.

Implementations of semiconductor packages may include one, all, or any of the following:

The first portion may be a portion of the at least one corner lead that does not contact a mounting surface of the semiconductor package.

The first portion of the lead is configured to have a space for coupling a wire bond thereto.

The semiconductor package may further include a second lead adjacent to the at least one corner lead where the second lead and the at least one corner lead have a lead pitch of at least 0.2 millimeters.

Implementations of semiconductor packages may include: a lead frame having at least one lead that may be located on an edge of the package, where the at least one lead may have a half etch on a first portion of the lead and a half etch on a second portion of the lead and where the first portion may extend internally into the package to create a mechanical mold compound lock between a mold compound and the lead. The second portion of the lead may be located on the edge of the package.

Implementations of semiconductor packages may include one, all, or any of the following:

The first portion may be a portion of the at least one lead that does not contact a mounting surface of the semiconductor package.

The first portion of the lead may be configured to have a space for coupling a wire bond thereto.

The semiconductor package may further include a second lead adjacent to the at least one lead where the second lead and the at least one lead have a lead pitch of at least 0.2 millimeters.

Implementations of a semiconductor package may be manufactured using implementations of a method of making semiconductor packages. The method may include providing a lead frame including at least one lead positioned at an edge of the package; etching one half of a first portion of the at least one lead at an outer edge of the lead adjacent to the edge of the package; and etching one half of a second portion of the at least one lead at an inner edge of the lead opposite the outer edge. The first portion may be configured to mechanically lock with a mold compound of the package and the first portion may not contact any edge of the package.

Implementations of semiconductor packages may include one, all, or any of the following:

The first portion may be a portion of the at least one lead that does not contact a mounting surface of the semiconductor package.

The first portion of the lead may be configured to have a space for coupling a wire bond thereto.

The semiconductor package may further include a second lead adjacent to the at least one lead where the second lead and the at least one lead have a lead pitch of at least 0.2 millimeters.

The at least one lead may be a corner lead positioned where two edges of the packages meet.

The second portion may be located on at least one of the two edges of the package.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a view of a dual flat no leads package semiconductor package;

FIGS. 2A-2B are top views of a lead frame;

FIGS. 3A-3B is a bottom view of a lead frame;

FIG. 4A is a perspective view of a lead frame design;

FIG. 6A is a perspective view of an implementation of a lead frame design with leads on the edge of the package;

FIG. 6B is a front view of an implementation of a lead frame design from FIG. 6A;

FIG. 6C is a top view of an implementation of a lead frame design from FIG. 6A;

DESCRIPTION

Figure 4B:
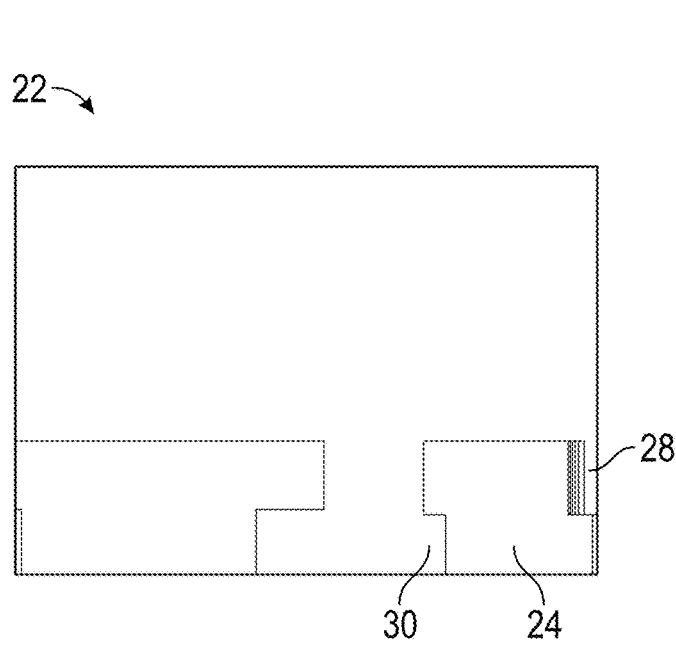
FIG. 4B is a front view of the lead frame design from FIG. 4A.

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages and implementing components and methods, consistent with the intended operation and methods.

Referring to FIG. 1, a dual flat no leads (DFN) package 2 is illustrated. A top of the package 4 and a bottom of the package 6 are shown, the bottom being the surface of the package in which the leads are exposed through mold compound. It can be seen that the design of the package keeps the bottom leads 8 away from the corners 10 of the package. Particular designs of QFNs and DFNs use a bottom half etch at the lead tip to prevent lead drop off during sawing or, for Leadless Land Grid Arrays, use of pre-plated lead frames. Pre-plated lead frames depends on chemical locking between mold compound and the pre-plated leads to prevent lead drop off. These particular designs may restrict the ability to make no lead packages smaller because additional space must be made available in the corners and edges of the package to provide sufficient space to keep the leads from dropping off during singulation. As described more fully below, these particular designs of the leads are not robust enough to permit movement of the leads to the edge of the packages because of the saw offsets used in the singulation processes.

Referring now to FIG. 2A, a top view of a lead frame 12, pre-singulation, is illustrated. The perimeter of an individual package 14 is outlined in the center of the lead frame 12. The corner leads 16 of the package are designed away from the corners of the package to prevent the leads from falling off during the sawing process. Referring to FIG. 2B, an enlarged view of one of the corner leads 16 is illustrated. The minimum half etch on a first portion 18 is used for compound locking. Referring to FIG. 3A, a bottom view of the lead frame shown in FIG. 2A is illustrated. As illustrated in FIG. 3B, leads 16 are designed to be away from the edges that form the package corner through a minimum half etch on the lead tip/second portion 20.

Figure 4C:
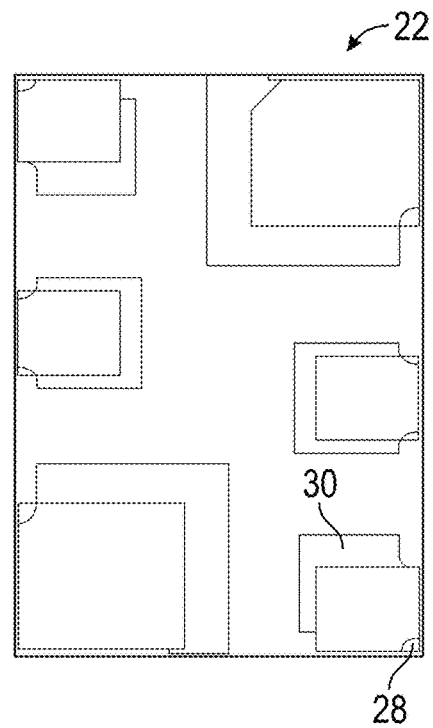
FIG. 4C is a top view of a lead frame design from FIG. 4A.
Figure 5A:
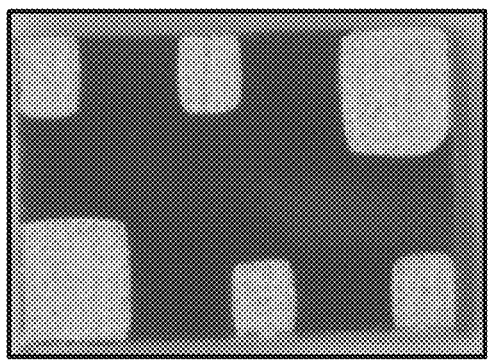
FIGS. 5A-5D are top views of no lead frames after package sawing.
Figure 5B:
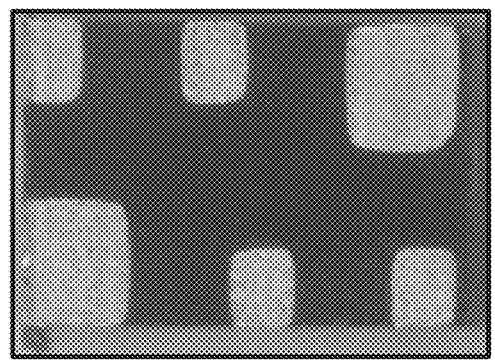
Figure 5C:
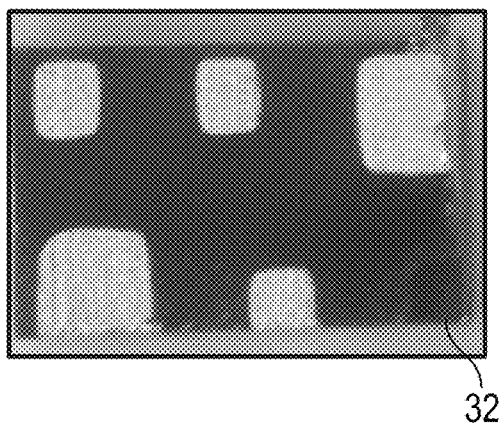
Figure 5D:
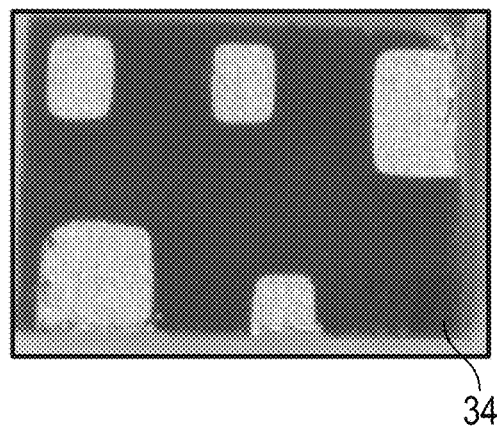

Referring to FIG. 4A, a perspective view of a no leads package 22 is illustrated. The leads 24 of the package are all located slightly away from the package edge 26. Referring to FIG. 4B, a front view of the package 22 is illustrated. In this view, a minimum half etch on a first portion 28 and a minimum half etch on a second portion 30 are visible. The first portion 28 and second portion 30 half etch are designed to aid in mold compound locking between the lead and the mold compound of the package. Referring to FIG. 4C, a top view of the package is illustrated showing the minimum half etch on a first portion 28 and minimum half etch on a second portion 30. As can be observed, particularly in FIGS. 4A and 4C, the first portions 28 of the various leads are etched so that a side of the first portions still is located on a side of the package Referring now to FIG. 5A-5D, no lead packages as illustrated in FIGS. 4A-4C after sawing are illustrated. In FIG. 5A, there is no offset on the saw. In FIG. 5B, the saw offset from standard position is 10 microns. In FIG. 5C, the saw offset is 20 microns and it can be seen that a corner lead 32 has fallen off during sawing due to insufficient locking between the lead and the mold compound. In FIG. 5D, the saw offset is 30 microns and again a corner lead 34 has dropped off due to insufficient locking between the lead and the mold compound. Since these saw offsets are within the potential operating tolerances of singulation processes, the design of FIGS. 5A-5D is marginal, as it provides insufficient mold locking to prevent lead drop off during sawing.

Referring now to FIG. 6A, a perspective view of an implementation of semiconductor package 36 having a lead frame having leads on the edge of the package is illustrated. At least one lead 38 is located on the edge of the package 36—in other words, the metal of the lead is not offset from the edge through mold compound, but is right on the edge. In other implementations, the at least one lead on the edge of the package is a corner lead positioned where two edges of the package meet, such as the leads to the right and left of the lead 38 in FIG. 6A. Referring to FIG. 6B, a front view of an implementation of a semiconductor package 36 is illustrated. At least one corner lead 40 having a maximum half etch on a first portion 42 and a maximum half etch on a second portion 44 is illustrated. The size of a maximum half etch as used herein is larger than a conventional minimum half etch but not so large that the etch reduces the space 46 in FIG. 6C to prevent adequate area remaining for wire bonding. The first portion 42 of the lead extends internally into the package to create a mechanical mold compound lock between a mold compound of the package 36 and the lead 40. The mechanical mold compound lock may increase the robustness of the package. As can be seen in FIG. 6B, the first portion 42 of the lead does not contact the mounting surface of the semiconductor package. Also, no portion of the first portion 42 of the lead is located on an edge of the package, while the second portion 44 of the lead 40 is a corner lead positioned on the two edges of the package.

Referring to FIG. 6C, a top view of an implementation of lead frame 36 is illustrated. The first portion 42 of the lead 40 is configured to have space 46 for coupling a wire, such as a wire bond, thereto. The package 36 has a second lead 47 adjacent the at least one corner lead where the second lead 47 and the at least one corner lead 40 have a lead pitch/gap of at least 0.2 millimeters between them. As can be observed, the upper first portion of lead 47 also does not have any portion of its surface that touches or is located on the edge of the package, while the lower second portion is located on the edge of the package.

Figure 6D:
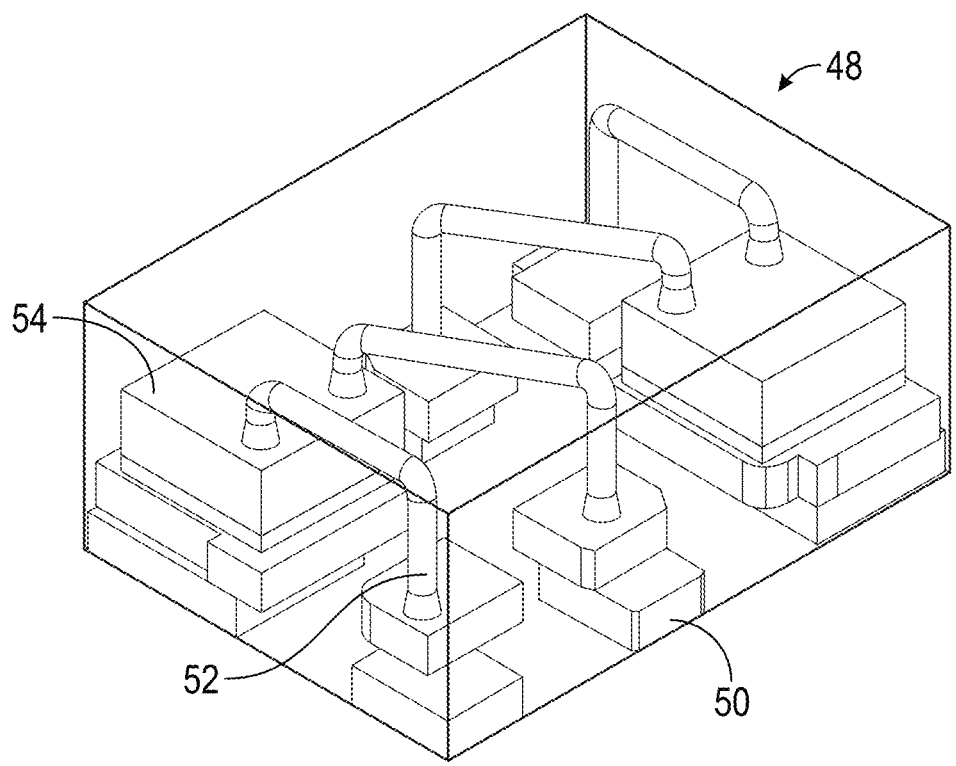
FIG. 6D is a perspective view of an implementation of a semiconductor package with an implementation of a lead frame design from FIG. 6A.

Referring to FIG. 6D, an implementation of a semiconductor package 48 is illustrated in see through format where the mold compound is made invisible. As is illustrated, lead 50 is on the edge of the package 48 and wirebonds are used to attached the first portions of the leads to die coupled to other leads within the package.

Figure 7A:
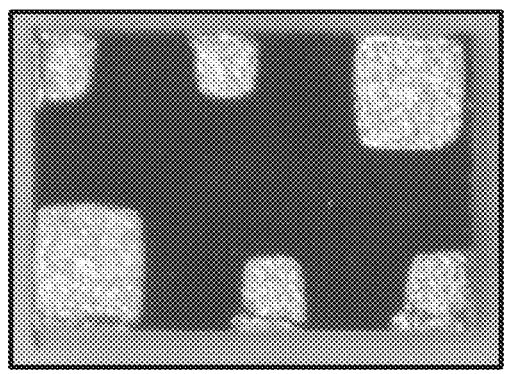
FIGS. 7A-7F are top views of implementations of a lead frame design having leads on the edge of the package after packaging sawing.
Figure 7B:
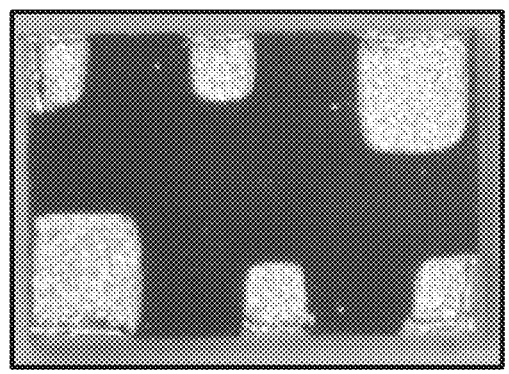
Figure 7C:
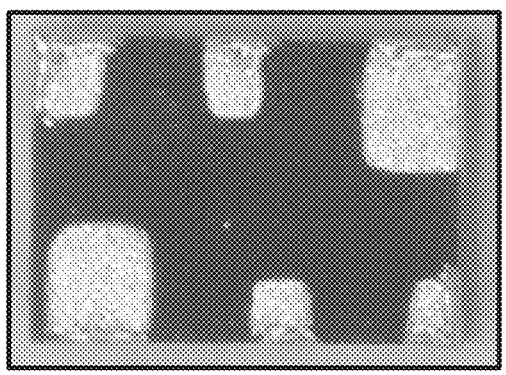
Figure 7D:
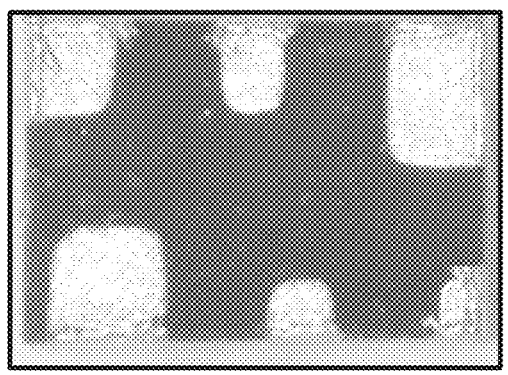
Figure 7E:
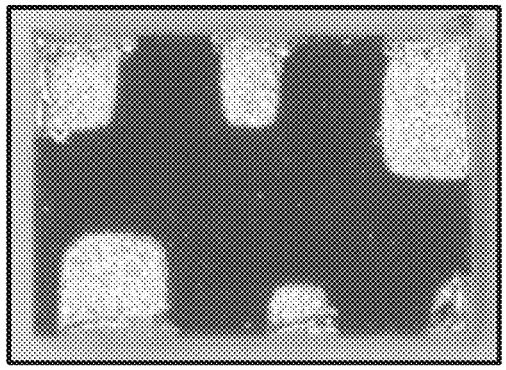
Figure 7F:
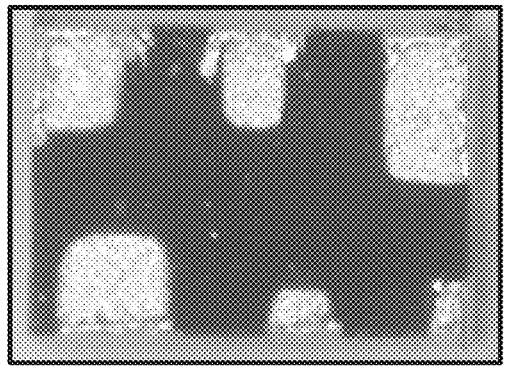

Referring to FIG. 7A-7F, the results of an experiment involving leads with structures like those illustrated in FIGS. 6A-D are shown. The photographs are of the bottom side of the package after sawing. The saw offset ranges are 0 µm (FIG. 7A), 10 µm (FIG. 7B), 20 µm (FIG. 7C), 30 µm (FIG. 7D), 40 µm (FIG. 7E) and 50 µm (FIG. 7F). As can be seen in the figure, no leads dropped off due to saw offset in all six of the examples. This visually demonstrates an improvement over the lead frame example illustrated in FIGS. 5C and 5D where the corner leads dropped off at saw offsets of just 20 µm and 30 µm. The improved mold compound locking achieved by implementing a maximum half etch on a first portion not located on an edge of the package and a maximum half etch on a second portion located on the edge of the package illustrates a robust lead design even up to 50 µm of saw offset. This increase in process robustness will allow for the leads to be placed at the edge of the package, rather than having to be offset.

Figure 8A:
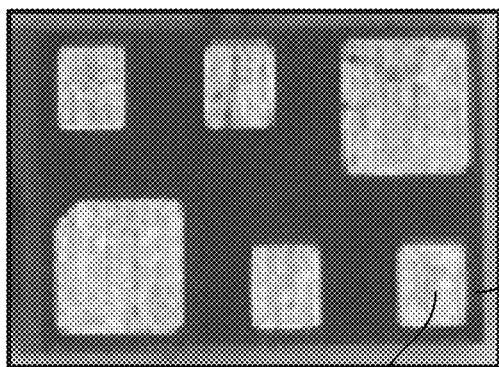
FIGS. 8A-8B show a comparison of a lead frame package, FIG. 8A, and an implementation of a lead frame having leads on the edge of the package, FIG. 8B.
Figure 8B:
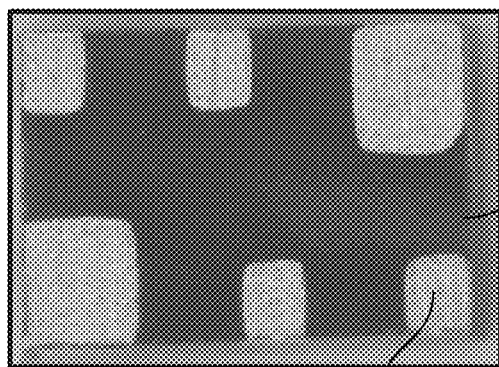

Referring now to FIGS. 8A and 8B, a visual comparison of a two semiconductor packages is illustrated. In FIG. 8A, a semiconductor package having leads designed away from the edge of the package is illustrated. As can be seen, there is a gap between the leads 56 and the edge of the package 58. Referring to FIG. 8B, in contrast, an implementation of semiconductor package having leads at/on the edge of the package is illustrated. With the leads placed at the edge of the package the package size can be decreased by at least 0.1 mm while still maintaining a minimum 0.2 mm lead gap/pitch between leads.

Method of semiconductor packages like those disclosed herein may be formed using implementations of a method of forming implementations of semiconductor packages. Method implementations may include providing a lead frame having at least one lead positioned at an edge of the package. One half of a first portion of the at least one lead may be etched at an outer edge of the lead adjacent to the edge of the package. One half of a second portion of the at least one lead may be etched at an inner edge of the lead opposite the outer edge. The lead frame may be etched using chemical etching, dry etching, laser cutting, hard tool etching or any suitable method known in the art.

Furthermore, the materials used for the leads may be any of those used for leads and lead frames known in the art, including, by non-limiting example, copper, copper alloys, silver, aluminum, any combination thereof, and any other electrically conductive material. Furthermore, the leads may be coated with any number of other electrically conductive materials, such as, by non-limiting example, silver, gold, nickel, platinum, palladium, tin, titanium, or any combination thereof. Also, the mold compounds used in various package implementations may be any of a wide variety known, including epoxies, thermally conductive epoxies, resins, and the like.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
a lead frame comprising at least one corner lead, the at least one corner lead positioned where two outer edges of the package meet, and the at least one corner lead having a half etch on a first portion of the lead and a half etch on a second portion of the lead;
wherein the first portion extends internally into the package to create a mechanical mold compound lock between a mold compound of the package and the lead;
wherein the second portion is located on at least one of the two outer edges of the package;
wherein the second portion is a portion of the at least one corner lead that contacts a mounting surface of the semiconductor package; and
wherein the mounting surface extends to at least one of the two outer edges of the package.

2. The semiconductor of claim 1, wherein the first portion is a portion of the at least one corner lead that does not contact a mounting surface of the semiconductor package.

3. The semiconductor of claim 1, wherein the first portion of the lead is conFIG.d to have space for coupling a wire bond thereto.

4. The semiconductor of claim 1, further comprising a second lead adjacent to the at least one corner lead where the second lead and the at least one corner lead have a lead pitch of at least 0.2 millimeters.

5. A semiconductor package comprising:
a lead frame comprising at least one lead that is located on an outer edge of the package, the at least one lead having a half etch on a first portion of the lead and a half etch on a second portion of the lead;
wherein the first portion extends internally into the package to create a mechanical mold compound lock between a mold compound and the lead;
wherein the second portion of the lead is located on the outer edge of the package;
wherein the second portion is a portion of the at least one lead that contacts a mounting surface of the semiconductor package; and
wherein the mounting surface extends to the outer edge of the package.

6. The semiconductor of claim 5, wherein the first portion is a portion of the at least one lead that does not contact a mounting surface of the semiconductor package.

7. The semiconductor of claim 5, wherein the first portion of the lead is configured to have space for coupling a wire bond thereto.

8. The semiconductor of claim 5, further comprising a second lead adjacent to the at least one lead where the second lead and the at least one lead have a lead pitch of at least 0.2 millimeters.

* * * * *

UNITED STATES PATENT AND TRADEMARK OFFICE
CERTIFICATE OF CORRECTION

PATENT NO. : 10,825,754 B2
APPLICATION NO. : 15/230179
DATED : November 3, 2020
INVENTOR(S) : Soon Wei Wang et al.

Page 1 of 1

It is certified that error appears in the above-identified patent and that said Letters Patent is hereby corrected as shown below:

In the Claims

In Column 6, Line 18, Claim 3 delete "conFIG.d" and replace with -- configured --.

Signed and Sealed this
Fifth Day of January, 2021

Andrei Iancu
*Director of the United States Patent and Trademark Office*